Jan. 2, 1962 E. B. VASS 3,015,785

LC TYPE TRANSISTOR OSCILLATOR

Filed Dec. 29, 1958 4 Sheets-Sheet 1

INVENTOR
ERIC BURNETT VASS
BY
[signature]
AGENT

Jan. 2, 1962 E. B. VASS 3,015,785

LC TYPE TRANSISTOR OSCILLATOR

Filed Dec. 29, 1958 4 Sheets-Sheet 2

INVENTOR
ERIC BURNETT VASS

BY Frank R. Trifari
AGENT

Jan. 2, 1962 E. B. VASS 3,015,785

LC TYPE TRANSISTOR OSCILLATOR

Filed Dec. 29, 1958 4 Sheets-Sheet 3

INVENTOR
ERIC BURNETT VASS
BY [signature]
AGENT

Jan. 2, 1962 E. B. VASS 3,015,785
LC TYPE TRANSISTOR OSCILLATOR
Filed Dec. 29, 1958 4 Sheets-Sheet 4

INVENTOR
ERIC BURNETT VASS
BY
Frank R. Jeffari
AGENT 3,015,785

LC TYPE TRANSISTOR OSCILLATOR

Eric B. Vass, Kingston Park, South Australia, assignor to North American Philips Company, Inc., New York, N.Y., a corporation of Delaware Filed Dec. 29, 1958, Ser. No. 783,504
4 Claims. (Cl. 331—117)

Figure 1:
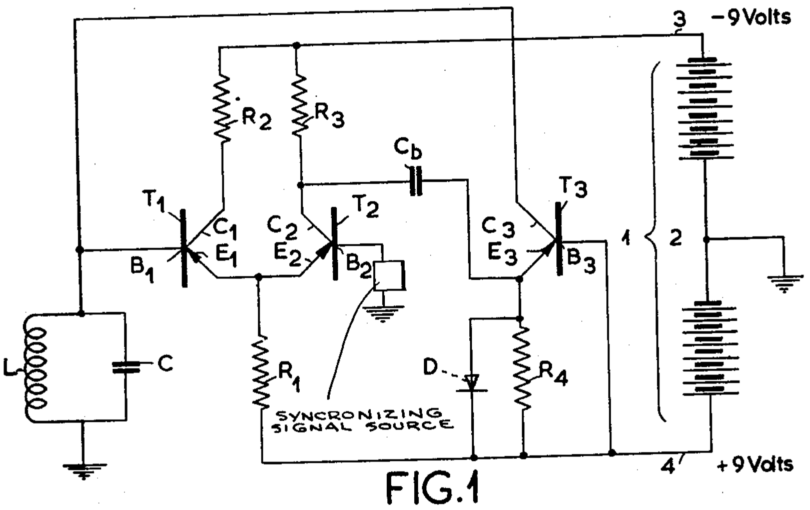

This invention has for its principal object to devise a circuit for an oscillation generator for producing oscillations of a stable frequency which may be synchronized by the injection of high order harmonics of the frequency to be generated and/or which may be used for the production of high harmonics of the frequency of the oscillations generated by the circuit.

One of the main requirements of an oscillator such as that envisaged by this invention is that it should possess an inherent frequency stability in order to minimize the possibility of locking to an undesired sub-harmonic of the synchronizing frequency.

An oscillator circuit according to the invention is primarily stabilized by means of an inductance capacitance tuned to approximate shunt resonance with the desired frequency to be generated.

One terminal of this inductance is connected to a point of constant potential and the other terminal to the base electrode of a first transistor. The collector electrode of this first transistor is fed through a resistance from a point of constant potential which is negative with respect to the base of the transistor, and the emitter of his transistor is similarly fed via a resistance from a point of constant potential which is positive with respect to the base of the transistor.

The emitter of this first transistor is also connected to the emitter of a second transistor, the base electrode of which is connected to the point of constant potential to which one end of the said inductance is connected. The collector of this second transistor is connected via a suitable resistance to a point of constant potential negative with respect to the base and is also coupled to the emitter of a third transistor by means of a coupling capacitor or other suitable means.

Moreover, the emitter of this third transistor is connected via a suitable resistance to a point of constant potential which is also connected to the base of this third transistor and which is positive with respect to the potential of the end of the inductance connected to a point of constant potential.

The collector of this third transistor is connected to the base of the first transistor which, as has been stated above, is connected to one end of the said inductance.

This circuit forms an oscillation generator of marked inherent frequency stability. In one embodiment of the invention a change in any component value other than those forming the resonant circuit of plus or minus 20 percent caused a change in frequency of less than 0.3 percent. Simultaneous changes of up to 50 percent in the positive and negative potentials feeding the transistors have a negligible effect on frequency, while a reduction of the total supply voltage from 18 volts (—9 volts plus +9 volts) to six volts (—3 volts plus +3 volts) varied the frequency of the oscillations generated by only 0.4 percent. The output of this oscillation generator circuit with a total supply voltage of 18 volts produced a good sine wave of 2.5 volts R.M.S. across the inductance with a total current drain of only 0.2 milliampere.

High order harmonics may be conveniently derived from the collectors of the first or second transistors.

This circuit has been found to be particularly suitable for synchronization by means of a frequency which is a high harmonic of the frequency of the oscillations to be generated. Such a synchronizing signal may be injected either in series with the base of the second transistor or in series with the resistor which is common to the emitters of the first and second transistors. In the embodiment referred to above synchronization was achieved successfully with frequencies as high as 200 times the frequency which it is desired to generate.

These various advantages are believed to be due to the very high impedance of the collector of the third transistor which enables this electrode to be connected directly to the tuned circuit, and to the combination of the short base of the transistors and high loop gain which produces a wave form having a very steep front thus rendering the circuit susceptible to synchronization which can be of great precision.

The invention thus primarily consists in an oscillation generator which comprises a tuned or resonant circuit in combination with means for deriving from the oscillations generated in the tuned circuit a wave of substantially rectangular wave form, and means for amplifying the said substantially rectangular wave in combination with means for feeding back the amplified substantially rectangular wave in the proper phase to maintain the oscillations in the tuned circuit.

Such an oscillation generator may be stabilized, according to the invention, by superimposing a wave of suitable frequency either on the generated wave before deriving the substantially rectangular wave, or upon the substantially rectangular wave after it has been derived but before it is fed back to maintain oscillations. If the synchronizing wave is superimposed on the wave of substantially rectangular waveform, it may be superimposed on the wave as a whole, or only or mainly upon positive or negative excursions of the wave and on the sloping sides of the substantially rectangular waveform.

An oscillation generator according to the invention stabilized by a higher frequency may be used as a frequency divider delivering to an output circuit a wave having a frequency which is a small fraction of the frequency of the synchronizing wave or in certain cases a multiple of such a fraction.

A circuit according to the invention which generates oscillations of reasonably good frequency stability is depicted in FIG. 1 of the accompanying drawings.

In FIG. 1, L denotes an inductance tuned to the desired frequency by a shunt condenser C. One terminal of the inductance is connected, preferably via a ground connection, to the centre tap 2 of an 18 volt battery or other source 1 of D.C. power, while the other terminal of the inductance is connected to the base electrode $B_1$ of a transistor $T_1$. The collector $C_1$ of this transistor is connected to the negative terminal 3 of the power source 1 via a resistance $R_2$ of about 22,000 ohms, while the emitter $E_1$ of the same transistor $T_1$ is connected to the positive pole of the power source 1 via a resistance $R_1$ of about 47,000 ohms and also to the emitter electrode $E_2$ of a second transistor $T_2$.

The collector $C_2$ of this second transistor is connected to the negative terminal 3 of the power source 1 via a resistance $R_3$ of about 22,000 ohms, while the base $B_2$ of this second transistor is connected to the centre tap 2 of the power source 1, for instance via a ground connection.

The collector electrode $C_2$ of transistor $T_2$ is also connected via a blocking condenser $C_b$ to the emitter electrode $E_3$ of a third transistor $T_3$, the base electrode $B_3$ of which is connected to the positive pole 4 of the power source 1 and the collector electrode $C_3$ of which is connected to a tap on the tuned circuit.

The transistors are of the type known as OC73.

The operation of this circuit when generating oscillations may be explained as follows.

If it be assumed that oscillations exist in the tuned circuit formed by the inductance L and the capacity C, these oscillations will apply to the base electrode $B_1$ of the transistor $T_1$ an oscillating voltage. The electrodes of the transistor $T_1$ are so biased by the power supply source 1 and the resistances $R_1$ and $R_2$ that the collector current of the transistor $T_1$ is greatly reduced when the transistor $T_2$ is passing collector current, and vice versa, under which circumstances practically only negative half cycles of the oscillatory voltages will pass through the base emitter circuit of the transistor $T_1$ which in effect will clip the positive half cycles of the sinusoidal wave. These negative half cycles will cause a positive going part of a cycle of current of approximately rectangular waveform to flow through the collector emitter path of the transistor $T_1$.

As the emitter $E_1$ of the transistor $T_1$ is connected to the emitter electrode $E_2$ of transistor $T_2$, the voltage of the emitter of this transistor $T_2$ will vary similarly to that of the emitter $T_1$, thus causing substantially rectangular half cycles of current to flow through the collector electrode of the transistor $T_2$ having a phase similar to that of the half cycles of current through the collector $C_1$, but with clipping of the negative half cycles. These half cycles of voltage will be transferred to the emitter electrode $E_3$ of the third transistor $T_3$ by the blocking condenser $C_b$.

The connections of this transistor are such that negligible current flows from the power source 1, unless the emitter electrode $E_3$ has its voltage with respect to the base electrode $B_3$ increased in a positive direction. When this occurs, pulses of current will flow through its collector electrode $C_3$ via the inductance L, the direction of these pulses being such as to tend to maintain oscillations in the tuned circuit formed by inductance L and capacity C.

It will be noted that the only damping effective in the tuned circuit L, C apart from its own resistance, is the resistance of the base electrode of transistor $T_1$ and of the collector of transistor $T_3$ and, as the resistance of the transistors viewed from these electrodes is very high, the damping due to these electrodes is very small and consequently the frequency stability of the oscillations is very good.

Figure 2:
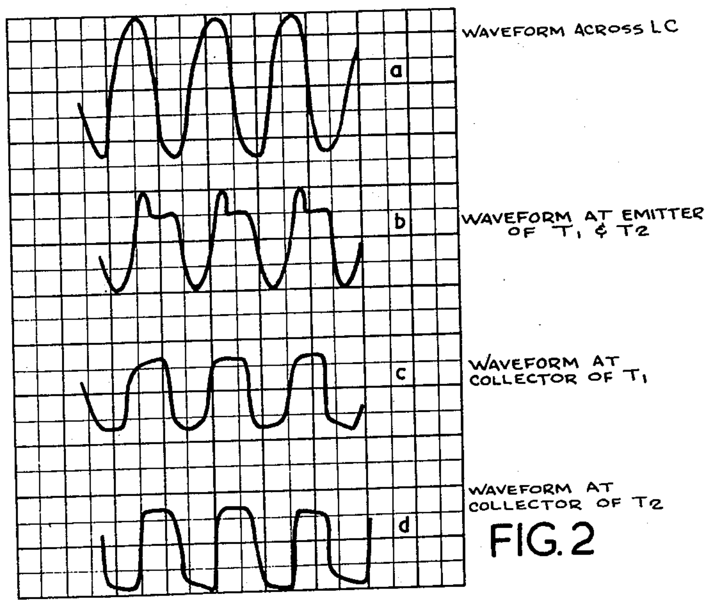

The waveforms at various points in the circuit of FIG. 1 are depicted in FIG. 2 wherein (*a*) illustrates the waveform of the voltage across the tuned circuit L, C, (*b*) that at the emitter electrodes of the transistors $T_1$ and $T_2$, (*c*) is that at the collector electrode of the transistor $T_1$ and (*d*) that at the collector electrode of the transistor $T_2$.

It will be seen from FIG. 2(*d*) that the wave at the collector electrode of transistor $T_2$ is substantially rectangular in shape.

The amplitude scale of curves (*c*) and (*d*) is approximately one-tenth of that of curves (*a*) and (*b*), there being appreciable voltage amplification in the transistors.

As the collector electrode of the transistor $T_2$ is coupled to the emitter electrode of the transistor $T_3$, the collector of which is coupled to the tuned circuit L, C, pulses of the waveform shown in curve (*d*) will be applied to the said tuned circuit. Thus the circuit in effect amplifies and clips the sinusoidal wave generated in the tuned circuit to produce a wave of substantially rectangular waveform which is fed back to the tuned circuits for producing oscillations.

Figure 3:
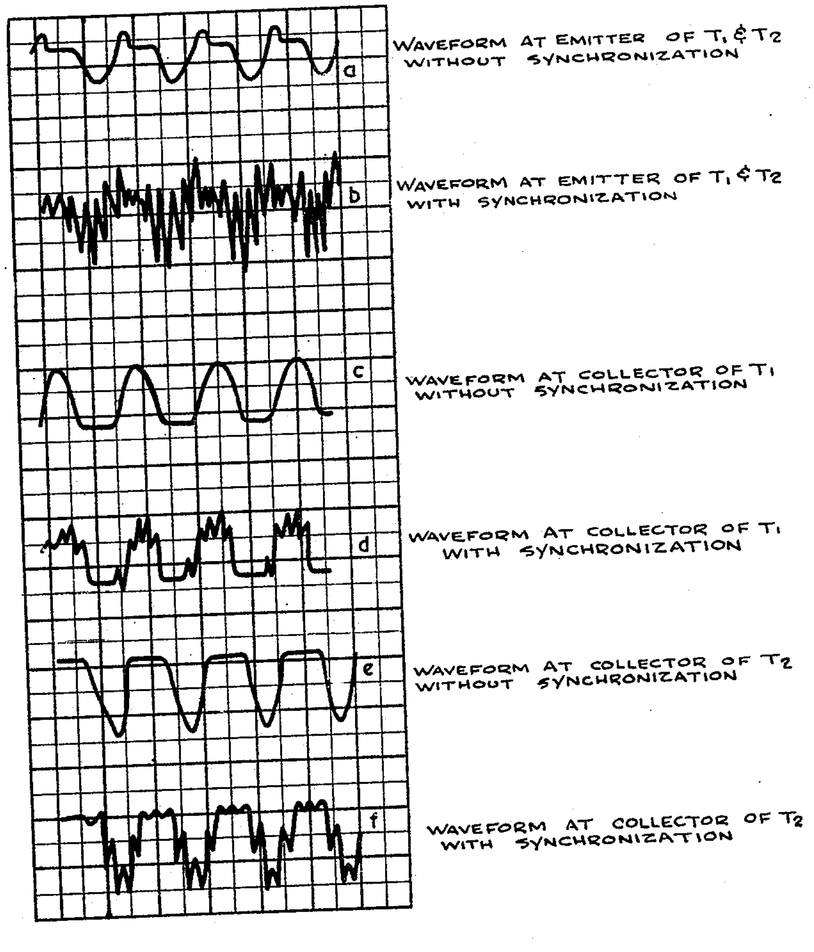

The circuit depicted in FIG. 1 has been found to be particularly susceptible to synchronization by a wave of much higher frequency which may be applied to any convenient point in the circuit. Examples of waveforms which occur when such a synchronizing wave is applied in series with the tuned circuit L, C and the base electrode of transistor $T_1$, the synchronizing wave being superimposed on the generated sinusoidal wave before the latter is applied to the base electrode of transistor $T_1$ are shown in FIG. 3. In this figure curve (*a*) is the waveform at the emitter electrodes or the transistors $T_1$ and $T_2$ with the sychronizing wave switched off, while curve (*b*) is the waveform at the same point with the synchronization wave switched on. It will be seen that the positive going half cycles of the combined wave are clipped whereas the negative going half cycles are not clipped.

Curve (*c*) in FIG. 3 shows the waveform at the collector electrode of the transistor $T_1$ with the synchronizing wave switched off, while curve (*d*) in the same figure shows the waveform at the same point with the synchronizing wave switched on. It will be noted that at this collector electrode the negative going cycles of the waveform are very severely clipped.

Curves (*e*) and (*f*) of FIG. 3 show the waveforms at the collector electrode of the transistor $T_2$, curve (*e*) being that with the synchronizing wave switched off and curve (*f*) being that with the synchronizing wave switched on. It will be noted that the positive going half cycles are very severely clipped, whereas the clipping on the negative cycles is not so severe. Furthermore it will be seen that the synchronizing wave is very much in evidence on the steep sides of the substantially rectangular waveform. It has been observed that synchronization occurs while these pulses from the synchronizing wave remain on the sloping sides, but when the pulses move so that they fall on the flat top of the rectangular curve (*f*) or if the amplitude of the synchronizing wave is increased so that it is comparable with that of the substantially rectangular waveform, the synchronization "slips."

The waveform of curve (*f*) of FIG. 3 forms the basis of the pulses applied to the tuned circuit L, C by the transistor $T_3$ with the possibility that the pulses will be still further clipped in that transistor. As the tuned circuit L, C is not resonant with the synchronizing wave, presumably only the substantially rectangular pulses will tend to maintain oscillations, this presumption being mentioned to add clarity to a possible explanation of the synchronizing process given later.

Figure 4:
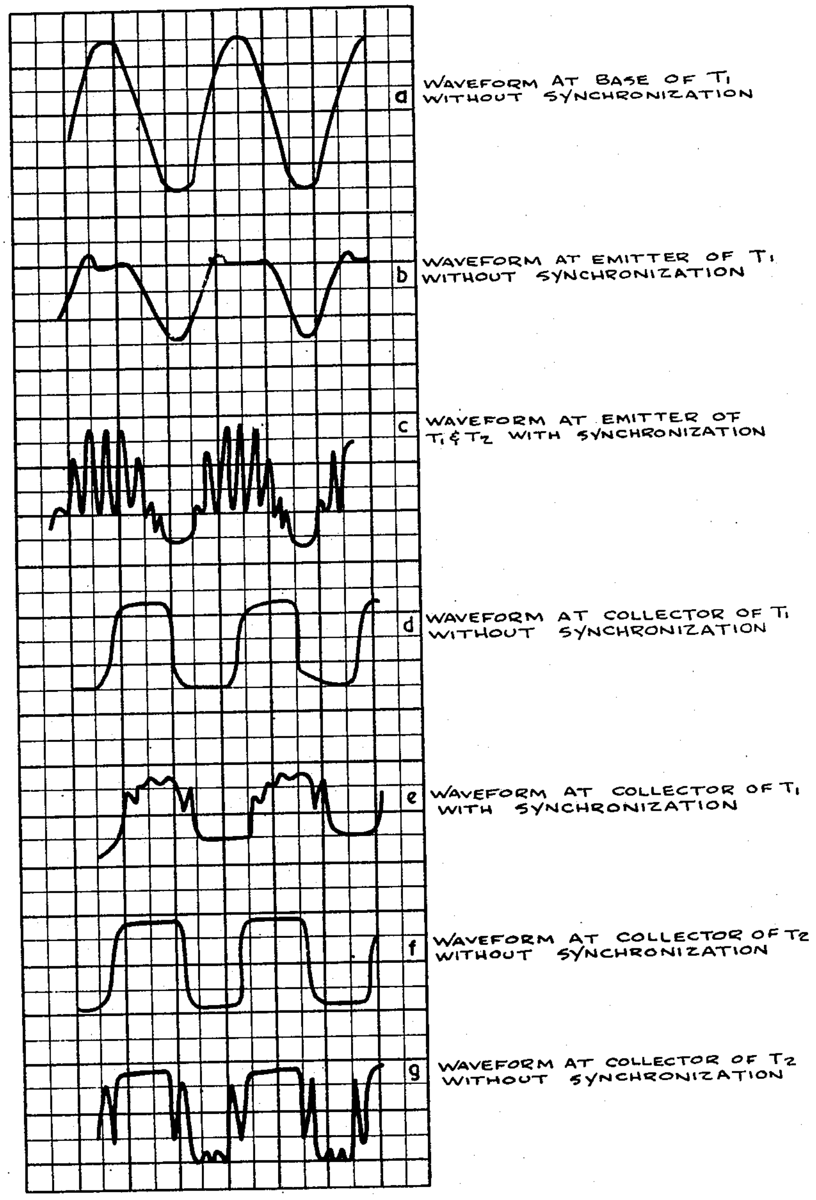

The waveforms shown in FIG. 4 are those at various points of the circuit when the synchronizing wave is applied in series with the base electrode of transistor $T_2$. Curves (*a*), (*b*), (*d*) and (*f*) are for the waveforms at the base electrode of the transistor $T_1$ at the emitter electrode of transistor $T_1$, the collector electrode of transistor $T_1$ and at the collector electrode of transistor $T_2$, respectively, without the synchronizing wave switched on these being similar to the waveforms of FIG. 2.

Curve (*c*) of FIG. 4 shows the waveform at the emitter electrodes of the transistors $T_1$ and $T_2$ with the synchronizing wave applied to the base electrode of transistor $T_2$, and it will be observed that the negative going half cycles are severly clipped, the synchronizing wave appearing only on the flat tops of the substantially rectangular waveform.

Curve (*e*) of the same figure shows the waveform at the collector electrode of the transistor $T_1$ and it will be noted that the negative going half cycles are severely clipped, the positive going cycles are partially clipped and the synchronizing waveform is substantially in evidence only on the sloping sides of the substantially rectangular waveform.

Curve (*g*) of FIG. 4 depicts the waveform at the collector electrode of the transistor $T_2$ and it will be observed that the synchronizing waveform is mainly in evidence on the sloping sides of the substantially rectangular waveform, is only slightly in evidence on the negative going half waves of the waveform, and is not in evidence at all on the top of the positive going half cycles. This waveform closely resembles that of FIG. 3(*f*) with more perfect clipping of the positive half cycles.

This waveform shown in FIG. 4(*g*) is the basis of the waveform of the pulses applied to the tuned circuit L, C by the transistor $T_3$ possibly being still further clipped, so that the pulses so applied to the tuned circuit are likely to comprise the substantially rectangular waveform with the synchronizing pulse superimposed on the sloping sides of the rectangular waveform.

It was observed that with the synchronizing wave applied to the base electrode of the transistor $T_2$ not only was synchronization of the generated wave secured by high multiples of the frequency of the generated oscillations, but that such synchronization was also secured by synchronizing waves which were a high multiple of a fraction of the frequency of the generated oscillations, the two frequencies being related only in that they had a common factor.

Figure 5:
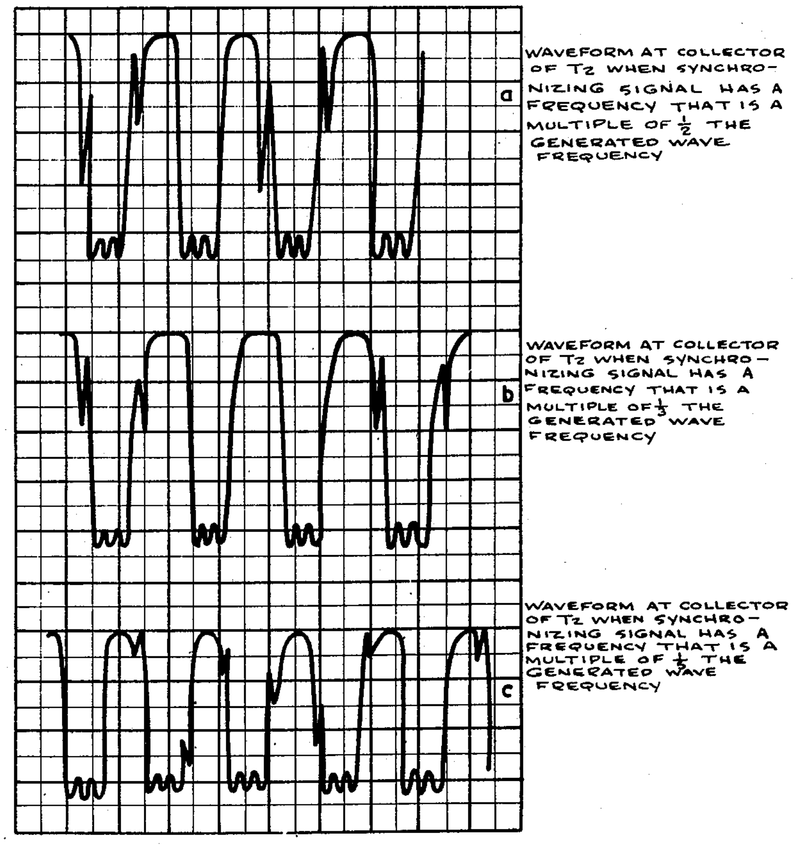

The curves (*a*), (*b*) and (*c*) in FIG. 5 depict waveforms at the collector electrode of transistor $T_2$ for cases in which the synchronizing wave had a frequency which was a multiple respectively of one half, one third and one fifth of the frequency of the generated wave.

It will be observed that successive cycles of these waveforms are dissimilar, but that the waveforms of the cycles are repeated at intervals depending upon the highest common factor of the two frequencies. It will further be seen that either one cycle of the synchronizing wave is present on the sloping sides of the substantially rectangular waveform or none at all. No case was observed in which synchronization occurred and in which more than one cycle of the synchronizing wave was present on the sloping sides of the rectangular wave although it may very well be that such could occur with extremely high frequency synchronizing waves. These matters are mentioned in order to add clarity to the possible explanation of the functioning of the invention given later. If the synchronizing wave is superimposed, at the emitter electrodes of the transistors $T_1$ and $T_2$, on the substantially rectangular waveform of the wave derived from the generated oscillations, the waveform at the collector electrode of the transistor $T_2$ is of the form shown in FIG. 4 but inverted, the synchronizing wave appearing mainly on the sloping sides of the substantially rectangular wave and in clipped form on the flat top of the positive half cycles of the substantially rectangular waveform, practically none being apparent on the negative half cycles.

It is thought that the remarkable facility with which oscillations generated in circuits according to the invention can be synchronized, is probably due to the fact that the superimposed synchronizing wave is in evidence exclusively or mainly on the steep sloping sides of the substantially rectangular waveform and that, in addition to there being some numerical relationship between the frequencies of the synchronizing wave and of the generated oscillations, there might be some approximate relationship between the duration of the said steep sloping sides and the duration of one cycle of the synchronizing waves. This results in a modification of the frequency of the generated wave such that the energy content of the effective portion of the substantially rectangular pulses fed back to maintain oscillations remains constant with the synchronizing wave superimposed on these steep sloping sides despite any dissimilarity between the shapes of the successive individual substantially rectangular pulses, this action differing somewhat from the action of a synchronized sinusoidal valve oscillator in which short pulses superimposed on the sinusoidal waves result in an earlier commencement of the feeding back of energy from anode circuit to maintain oscillations in the tuned circuit of the well-known oscillating valve circuits.

It has been observed that if a variable resistance (not shown) be connected between the tuned circuit L, C in FIG. 1 and the base electrode of transistor $T_1$, adjustment of this variable resistance can bring the tuned circuit into a condition suitable for synchronization, provided that the tuning of the tuned circuit is substantially correct. The ease with which this can be done suggests, that some effect other than the slight change in resonance frequency of the tuned circuit caused by variation of this resistance assists in promoting a condition suitable for synchronization. Observation shows that this resistance affects the steepness and hence the duration of the steep sides of the substantially rectangular waveform.

It has also been found that the connection of a rectifier D across the resistance $R_4$ (as shown in dotted lines) in FIG. 1, with its direction of conductivity the reverse to that of the emitter, still further improves the facility of the circuit to accept synchronization. Such a rectifier prevents the accumulation of an electrical charge between the emitter and its current supply and also possibly improves the clipping action of the circuit and it assists in obtaining a substantially rectangular waveform with the synchronizing wave mainly confined to its steep sloping sides for feed-back purposes.

Moreover it has been observed that, if the amplitude of the synchronizing wave is made so great that it is not removed from the tops and bottoms of the substantially rectangular waveform by the clipping action, the facility of the circuit to accept synchronization is very materially reduced, synchronization no longer being possible by a wave having a frequency which is very high in comparison with the frequency of the generated oscillations.

The output of an oscillation generator having the circuit shown in FIG. 1 may be taken from many points in the circuit but, according to the invention, the output should preferably be derived from the collector electrode of the transistor $T_1$. Shunt alternating current loading at this point has very little effect upon the functioning of the circuit. The waveform at the collector electrode of transistor $T_1$ has a substantially rectangular waveform component which may be easily isolated from the other components present and, consequently, it is particularly useful where an output of rectangular waveform is desired. On the other hand, a substantially sinusoidal waveform can be derived from the tuned circuit L, C by known means.

What is claimed is:

1. An oscillation generator comprising a resonant circuit, first, second and third transistors each having a base, emitter and collector electrode, a source of voltage having first and second terminals and an intermediate terminal, means connecting the base of said first transistor to said intermediate terminal by way of said resonant circuit, common resistance means connecting the emitters of said first and second transistors to said first terminal, separate resistance means connecting the collectors of said first and second transistors to said second terminal, means connecting the base of said second transistor to said intermediate terminal, means connecting the base of said third transistor to said first terminal, means connecting the collector of said third transistor to the base of said first transistor, resistance means connecting the emitter of said third transistor to said first terminal, and means coupling the collector of said second transistor to the emitter of said third transistor.

2. An oscillation generator comprising a resonant circuit, means for deriving from said resonant circuit a wave of substantially rectangular waveform, and means for feeding back said wave to maintain oscillations in said resonant circuit, said means deriving a rectangular wave comprising first, second and third transistors each having a base, emitter, and collector electrode, a source of voltage having first and second terminals, common resistance means connecting the emitters of said first and second transistors to said first terminal, separate resistor means connecting the collectors of said first and second transistors to said second terminal, capacitor means coupling the collector of said second transistor to the emitter of said third transistor, resistor means connecting the emitter of said third transistor to said first terminal, means connecting the base of said third transistor to said first terminal, one end of said resonant circuit being connected to the base of said first transistor, the other end of said resonant circuit and the base of said second transistor being connected to a tap on said source, said feedback means comprising means connecting the base of said first transistor to the collector of said third transistor.

3. The oscillation generator of claim 2, comprising a source of reference oscillations connected in series with the base electrode of said second transistor.

4. The oscillation generator of claim 2, comprising rectifier means connected in parallel with the resistor means connected to the emitter of said third transistor, said rectifier means having a polarity opposed to the conductivity of said emitter of said third transistor.

References Cited in the file of this patent

UNITED STATES PATENTS 2,794,124 Purington -------------- May 28, 1957

OTHER REFERENCES

Portable Transistor Frequency Standard, by Beyer, in Electronics, pages 194, 196, June 1957.